United States Patent
Allen et al.

(10) Patent No.: US 10,886,453 B2
(45) Date of Patent: Jan. 5, 2021

(54) COHERENCE CAPACITOR FOR QUANTUM INFORMATION ENGINE

(71) Applicants: Lockheed Martin Corporation, Bethesda, MD (US); Sabanci University, Istanbul (TR)

(72) Inventors: Edward Henry Allen, Bethesda, MD (US); Inanc Adagideli, Istanbul (TR); Anthony W. Jacomb-Hood, Littleton, CO (US)

(73) Assignees: Lockheed Martin Corporation, Bethesda, MD (US); Sabanci University, Istanbul (TR)

( * ) Notice: Subject to any disclaimer, the term of this patent is extended or adjusted under 35 U.S.C. 154(b) by 948 days.

(21) Appl. No.: 15/477,960

(22) Filed: Apr. 3, 2017

(65) Prior Publication Data
US 2018/0040799 A1    Feb. 8, 2018

Related U.S. Application Data

(60) Provisional application No. 62/371,630, filed on Aug. 5, 2016.

(51) Int. Cl.
*H01L 37/00*   (2006.01)
*H01L 37/02*   (2006.01)
(Continued)

(52) U.S. Cl.
CPC ............... *H01L 37/02* (2013.01); *B28B 1/00* (2013.01); *F01K 27/00* (2013.01); *F03G 7/00* (2013.01);
(Continued)

(58) Field of Classification Search
CPC ..................................................... H01L 37/00
(Continued)

(56) References Cited

U.S. PATENT DOCUMENTS 4,323,808 A * 4/1982 Davis ....................... H02N 3/00
                                                                310/11
4,658,171 A * 4/1987 Hawley ................. H02N 11/002
                                                                307/151

(Continued)

FOREIGN PATENT DOCUMENTS

| JP | 2008-108927 A | 5/2008 |
| WO | WO 2014/028302 | 7/2004 |
| WO | WO 2014/020595 | 2/2014 |

OTHER PUBLICATIONS

Fink et al, Quantum-To-Classical Transition in Cavity Quantum Electrodynamics, 2010.
(Continued)

*Primary Examiner* — Adi Amrany
(74) *Attorney, Agent, or Firm* — Baker Botts L.L.P.

(57) ABSTRACT

System for storing and using energy quantum mechanically includes an electronic device that produces heat while operating. A quantum heat engine can be in thermal contact with and electrically connected to the electronic device. The heat produced by the electronic device can dissipate to the quantum heat engine. The quantum heat engine can induce a current to bias the electronic device. Methods for storing and using memory resource to convert heat into electrical work, coherence capacitors, methods for quantum energy storage, and quantum heat engines, are also disclosed.

24 Claims, 9 Drawing Sheets

(51) Int. Cl.
*B28B 1/00* (2006.01)
*F01K 27/00* (2006.01)
*H02J 1/00* (2006.01)
*F03G 7/00* (2006.01)
*F03G 7/10* (2006.01)
*H02J 7/00* (2006.01)
*H02J 7/34* (2006.01)
*H02N 11/00* (2006.01)

(52) U.S. Cl.
CPC ............... *F03G 7/10* (2013.01); *H01L 37/00* (2013.01); *H02J 1/00* (2013.01); *H02J 7/0063* (2013.01); *H02J 7/345* (2013.01); *H02N 11/008* (2013.01)

(58) Field of Classification Search
USPC ......................................................... 307/149
See application file for complete search history.

(56) References Cited

U.S. PATENT DOCUMENTS

| | | | |
|---|---|---|---|
| 9,909,460 | B2 | 3/2018 | Allen |
| 2003/0143958 | A1* | 7/2003 | Elias ............... H01L 23/3733 455/73 |
| 2004/0140537 | A1 | 7/2004 | Il'ichev |
| 2011/0252798 | A1* | 10/2011 | Allen ............... F01K 27/00 60/645 |
| 2012/0060884 | A1* | 3/2012 | Orem ............... H01L 35/32 136/205 |
| 2017/0309545 | A1* | 10/2017 | Hiller ............... H01L 35/34 |
| 2018/0038354 | A1* | 2/2018 | Allen ............... B28B 1/00 |

OTHER PUBLICATIONS

Grajear et al; Sisyphus cooling and amplification by a superconducting qubit, 2008.
Extended European Search Report; 06744167.1-1022/3250792; PCT/US2016015581 dated Dec. 6, 2018.
Scully et al., "Using Quantum Erasure To Exorcize Maxwell's Demon: I. Concepts and Context", Physica E 29 (2005) 29-39.
Rostovtsev, Yuri, et al., "Using Quantum Erasure To Exorcise Maxwell's Demon: II. Analysis", Physica E 29 (2005) 40-46.
Ramandeep S. Johal, "Quantum Heat Engines And Nonequilibrium Temperature", Quant. Ph., 4394v1, Sep. 2009.
Ye Yeo et al., "Quantum Heat Engines And Information", Quant. Ph., 2480v1, Aug. 2007.
Konig, M. et al., *The quantum spin Hall effect: Theory and experiment*, J. Phys. Soc. Jpn. 77, 031007 (2008).
Du, Lingjie, et al. "Robust helical edge transport in gated InAs/GaSb bilayers." *Physical review letters* 114.9 (2015): 096802.
Hasan, M. Zahid, and Charles L. Kane. "Colloquium: topological insulators." *Reviews of modern physics* 82.4 (2010): 3045.
I. Adagideli et al., Effects of electron scattering on the topological properties of nanowires: Majorana fermions from disorder and superlattices, Phys. Rev. B 89, 144506 (2014).
Quan, H. T., et al. "Maxwell's demon assisted thermodynamic cycle in superconducting quantum circuits." *Physical review letters* 97.18 (2006): 180402.

* cited by examiner

COHERENCE CAPACITOR FOR QUANTUM INFORMATION ENGINE

CROSS-REFERENCE TO RELATED APPLICATIONS

This application claims the benefit under 35 U.S.C. § 119(e) of the priority of U.S. Provisional Application No. 62/371,630, entitled "COHERENCE CAPACITOR AND QUANTUM HEAT ENGINE" and filed on Aug. 5, 2016, the entire disclosure of which is hereby incorporated by reference.

FIELD

The disclosed subject matter generally relates to quantum energy storage, for example, a coherence capacitor for storing energy in nuclear quantum spins.

BACKGROUND

Current technologies for highly portable power systems can store energy in the form of un-reacted electrochemical components with potentials of a few electron volts per reaction. This limits the specific energy of such systems to a few megajoules per kilogram. Nuclear battery concepts can achieve a specific energy increase over electrochemical concepts but at the cost of ionizing radiation dangers, poor specific power by comparison to electrochemical solutions, and posing proliferation risks.

Techniques to store entropy rather than energy and to use entropy to improve energy harvesting from low quality sources have been proposed. For example, U.S. Pat. Pub. No. 2011/0252798, which is incorporated by reference in its entirety herein, describes systems and methods that use stored entropy to harvest energy using a "quantum heat engine" (QHE).

Quantum heat engines produce work using quantum matter as their working substance. A variety of theoretical QHEs have been proposed, such as those described in Scully et al., "Using Quantum Erasure To Exorcize Maxwell's Demon: I. Concepts And Context", Physica E 29 (2005) 29-39; and Rostovtsev, Yuri, et al., "Using Quantum Erasure To Exorcise Maxwell's Demon: II. Analysis", Physica E 29 (2005) 40-46; Ramandeep S. Johal, "Quantum Heat Engines And Nonequilibrium Temperature", Quant. Ph., 4394v1, September 2009; and Ye Yeo et al., "Quantum Heat Engines And Information", Quant. Ph., 2480v1, August 2007, each of which is incorporated herein by reference in its entirety. These theoretical quantum heat engines, however, can be impractical or impossible to reduce to practice and can be limited to use with either interacting or non-interacting working fluids and can be limited to use with either classical thermal reservoirs or quantum reservoirs.

Accordingly, there is a continued desire for improved quantum information engines and quantum heat engines that can take advantage of quantum coherence and correlations for efficient work harvesting.

SUMMARY

The purpose and advantages of the disclosed subject matter will be set forth in and apparent from the description that follows, as well as will be learned by practice of the disclosed subject matter. Additional advantages of the disclosed subject matter will be realized and attained by the methods and systems particularly pointed out in the written description and claims hereof, as well as from the appended drawings.

To achieve these and other advantages and in accordance with the purpose of the disclosed subject matter, as embodied and broadly described, a system for quantum energy storage is disclosed. The system for quantum energy storage can include a quantum information engine including a topological insulator having at least one edge. A coherence capacitor can include nuclei of atoms within the topological insulator. An energy source can be electrically connected to the quantum information engine (e.g., topological insulator edge) and can supply a current along the edge(s) of the topological insulator. The current can interact with at least one nucleus of the nuclei to flip a spin direction of the at least one nucleus.

For example and not limitation, there can be at least two edges. Additionally or alternatively, the nuclei initially can have any quantum mixture of spin directions. For example and not limitation, the nuclei can have nonzero spin, and each nucleus can initially have a spin direction. For purpose of illustration and not limitation, initial nuclear spin can be one of up-spin or down-spin.

As embodied herein, a quantum information engine can interact with a coherence capacitor. For example, the electrons that generate the current can be in a quantum edge state and can interact with at least one nucleus to flip the spin direction of the nucleus. Additionally the topological insulator can have a topologically protected quantum state at its edge and the topologically protected edge state can conduct electricity.

For example and not limitation, the energy source can be isolatable from the topological insulator. Additionally or alternatively, the current from the energy source can cause more than half of the nuclei to have a preferred spin direction. For purpose of illustration and not limitation, more than half of the nuclei can continue to have the preferred spin direction after isolation of the topological insulator from the energy source.

Additionally or alternatively, at least one load can be electrically connected to the topological insulator. The load can be powered at least in part by an induced current from the topological insulator. The current can be induced by interaction between the nuclei and electrons at the edge(s) of the topological insulator.

For example and not limitation, the current can be in a first or second direction along the edge(s) of the topological insulator. When the current is in the first direction, more electrons can move in the second direction than the first direction, and when the current is in the second direction, more electrons can move in the first direction than the second direction. Additionally, for at least one edge, each electron moving in the first direction can have an up-spin and each electron moving in the second direction can have a down-spin. Additionally or alternatively, along a second edge, each electron moving in the first direction can have an down-spin and each electron moving in the second direction can have a up-spin.

For purpose of illustration and not limitation, each nucleus that has a nonzero spin can interact with the electrons in the quantum information engine. For example, when one of the electrons having up-spin interacts with one of the nuclei having down-spin, the nucleus can flip to up-spin and the electron can backscatter in the second direction and flip to down-spin. Conversely, when one of the electrons having down-spin interacts with one of the nuclei having up-spin, the nucleus can flip to down-spin and the electron can backscatter in the first direction and flips to up-spin. Additionally, substantially all nuclei can be polarized to have a same spin direction due to interaction with the current. For example and not limitation, each nucleus can be polarized to have a same spin direction due to interaction with the current.

For purpose of illustration and not limitation, the topological insulator can be a two-dimensional topological insulator having at least two edges. For example, the topological insulator can be of an HgTe/HgCdTe quantum well, or an InAs/GaSb double well. Additionally or alternatively the topological insulator can include three-dimensional (3D) materials $Bi_{1-x}Sb_x$, $Bi_2Se_3$, $Bi_2Te_3$, $Sb_2Te_3$ . . . with surface states instead of edge states. Additionally or alternatively, the topological insulator can be doped with magnetic impurities.

For example and not limitation, the energy source can include at least two reservoirs electrically connected to the topological insulator and configured to supply a bias voltage across the topological insulator. The bias voltage can induce current along the edge(s) of the topological insulator. For purpose of illustration, a first reservoir can be electrically connected to a first end of the edge(s) and a second reservoir can be electrically connected to a second end of the edge(s). Additionally, the first reservoir initially can have one of a different temperature or a different chemical potential than the second reservoir.

In certain embodiments, at least one load can be electrically connected to at least one of the topological insulator or the energy source. The load can be powered at least in part by an induced current from the topological insulator, which can be induced by interaction between the plurality of nuclei and a plurality of electrons in the topological insulator. For purpose of illustration and not limitation, the first reservoir and the second reservoir can eventually have a same temperature and chemical potential after supplying current to the topological insulator, and the load can be powered by an induced current from the topological insulator. For purpose of illustration and not limitation, the load can be powered by an induced current from the topological insulator, wherein the chemical potential of the second reservoir can be higher and the topological insulator forces the induced-current to flow to the direction of higher voltage. For example and not limitation, after supplying current to the topological insulator, the reservoirs can shift their chemical potentials to account for the voltage drop at the load due to the power used by the load.

In another aspect of the disclosed subject matter, a method for quantum energy storage can include providing a quantum information engine including a topological insulator having at least one edge. A coherence capacitor can include nuclei of atoms within the topological insulator. A current can be supplied along the edge(s) of the topological insulator. A spin direction of at least one nucleus can be flipped by interaction between the nucleus and the current.

For purpose of illustration and not limitation, the current can be in a first or second direction along the edge(s) of the topological insulator. When the current is in the first direction, more electrons can move in the second direction than the first direction, and when the current is in the second direction, more electrons can move in the first direction than the second direction. Each electron moving in the first direction can have an up-spin and each electron moving in the second direction can have a down-spin in a certain basis. When one of the electrons having up-spin interacts with one of the nuclei having down-spin, the nucleus can flip to up-spin and the electron can backscatter in the second direction and flip to down-spin. When one of the electrons having down-spin interacts with one of the nuclei having up-spin, the nucleus can flip to down-spin and the electron can backscatter in the first direction and flip to up-spin.

For purpose of illustration and not limitation, the spin directions of more than half of the nuclei can be flipped to have a preferred spin direction. For example, up to substantially all nuclei (situated where the electronic edge state is situated) can be flipped to be polarized to have a same spin direction due to interaction with the current. Additionally or alternatively, at least one load electrically connected to the topological insulator can be powered at least in part by an induced current from the topological insulator induced by interaction between the plurality of nuclei and a plurality of electrons in the topological insulator. Additionally, the supplying of the current eventually can be stopped, and the load can be powered solely by the induced current from the topological insulator, e.g., via nuclear spin-flips. Alternatively, the supplying of the current eventually can be stopped and a resource stored in the spin direction of the nuclei can be stored without powering any circuit.

In another aspect of the disclosed subject matter, a combined quantum information engine and a coherence capacitor is disclosed. A topological insulator can include least one edge (acting as a quantum information engine) and a plurality of nuclei (acting as a coherence capacitor). The nuclei initially can be distributed having more spin up polarized nuclei than spin down polarized nuclei. Additionally, for purpose of illustration and not limitation, a load can be connected to the topological insulator to form a complete circuit, and the load can be powered by current induced by the topological insulator.

In another aspect of the disclosed subject matter, a system for storing and using quantum energy (e.g., storing and using quantum resource for energy extraction) can include an electronic device that produces heat while operating. A quantum heat engine can be in thermal contact with and electrically connected to the electronic device. The heat produced by the electronic device can dissipate to the quantum heat engine. The quantum heat engine can generate an induced current to bias the electronic device.

In some embodiments, the quantum heat engine can include a quantum information engine and a coherence capacitor. The quantum information engine can absorb heat from its surroundings and use coherence/memory resources from the coherence capacitor to generate the induced current. For purpose of illustration and not limitation, the quantum information engine can include a topological insulator having at least one edge, and the coherence capacitor can include nuclei of atoms within the topological insulator. Additionally, each of the nuclei can have a spin direction. For example, the topological insulator can have a plurality of electrons along the edge(s), and each electron initially can have a spin direction that is one of up-spin or down-spin corresponding to moving in a first direction or a second direction along the edge, respectively. When one of the electrons having up-spin interacts with one of the nuclei having down-spin, the nucleus can flip to up-spin and the electron can backscatter in the second direction and flip to down-spin, and when one of the electrons having down-spin interacts with one of the nuclei having up-spin, the nucleus can flip to down-spin and the electron can backscatter in the first direction and flip to up-spin. Such backscattering can perform the function of the quantum information engine, as described herein. For example and not limitation, there can be more up nuclear spins than down nuclear spins (or vice versa), and therefore, there can be more electrons scattering in one direction than the other. For purpose of illustration and not limitation, the current can be induced along the edge of the topological insulator as a first number of electrons moving in the first direction does not equal a second number of electrons moving in the second direction. For example, when the current is in the first direction, the first number of electrons moving in the first direction can be less than the second number of electrons moving in the second direction. Alternatively, when the current is in the second direction, the first number of electrons moving in the first direction can be greater than the second number of electrons moving in the second direction.

In certain embodiments, a direct current (DC) power source or an alternating current (AC) power source can be electrically connected to the topological insulator (e.g., to the quantum information engine and through it the coherence capacitor). For example and not limitation, each nucleus of the plurality of nuclei can be polarized to have a same spin direction due to interaction with a DC current when the DC power source is turned on. Additionally, for example and not limitation, the coherence capacitor (e.g., the plurality of nuclei of the topological insulator) can exchange energy with the source and the rest of the circuit, temporarily storing power in part of each circuit.

Additionally or alternatively, the DC power source can be electrically connected to the electronic device such that the electronic device is powered at least in part by the DC power source when the DC power source is turned on, and the electronic device can be powered by the quantum heat engine (e.g., by the quantum information engine using the resource of the coherence capacitor) when the DC power source is turned off. For example and not limitation, in certain embodiments, the DC power source can provide current corresponding to an average power consumption of the electronic device. Alternatively, the electronic device can be configured to not operate while the DC power source is turned on.

For purpose of illustration and not limitation, at least a portion of the power generated by the induced current can be dissipated as heat by the electronic device. Additionally, heat dissipated by the electronic device can equal to the heat absorbed and converted to electrical work by generating an induced current by the quantum heat engine. For example, a first portion of the power can be used to transmit energy from the electronic device and a second portion of the power can be dissipated as heat by the electronic device. For purpose of illustration and not limitation, the energy transmitted from the electronic device can include radiofrequency energy. Additionally or alternatively, in certain embodiments, ambient heat from a surrounding environment can be harvested and converted into electrical energy using the resources stored in the coherence capacitor, in the form of an additional current generated by the quantum information engine that power an electronic circuit.

In certain embodiments, the electronic device, the quantum information engine and the coherence capacitor can be in a same package. For example, the coherence capacitor and/or the quantum information engine can be integrated onto the electronic device. For purpose of illustration and not limitation, the quantum information engine and the coherence capacitor can be a single device integrated onto the electronic device.

Additionally or alternatively, a second electronic device can be electrically connected to the quantum heat engine (e.g., quantum information engine and coherence capacitor). For example, a first portion of the induced current can power the electronic device and a second portion of the induced current can power the second electronic device. Additionally or alternatively, the quantum heat engine can become cooler as the induced current is generated, and the electronic device can become cooler due to thermal contact with the quantum heat engine.

For purpose of illustration and not limitation, in certain embodiments, the first electronic device can dissipate less power than the second electronic device or vice-versa. Alternatively, the first and second electronic devices can dissipate the same power.

In certain embodiments, the electronic device can include logic circuitry to control the coherence capacitor. For purpose of illustration and not limitation, the electronic device can be one of an application specific integrated circuit (ASIC), a power amp (PA), a focal plane array (FPA), a radar transmitter, a mobile phone, a mobile computer device, an electric motor on an aircraft, or at least a part thereof.

In another aspect of the disclosed subject matter, a quantum mechanical method for storing and using energy can include storing energy (e.g., nuclear spin resources) in a coherence capacitor. The coherence capacitor can be in electrical contact with the quantum information engine, and the quantum information engine can be electrically connected to and in thermal contact with an electronic device. The electronic device can be operated to produce heat. An induced current can be generated by the quantum information engine to bias the electronic device using coherence/memory resources from the coherence capacitor.

In certain embodiments, storing energy can include storing memory resource in nuclear spins within the coherence capacitor, e.g., polarized nuclear spins. Additionally or alternatively, storing energy in the coherence capacitor can include supplying direct current (DC) power to the coherence capacitor. For purpose of illustration and not limitation, a DC power source can be electrically connected to the coherence capacitor.

For purpose of illustration and not limitation, energy can be transmitted from the electronic device. For example, a first portion of the power generated by the induced current can be used to transmit energy from the electronic device and a second portion of the power generated by the induced current can be dissipated as heat by the electronic device.

Additionally or alternatively, a second electronic device can be powered with the induced current. For example, a first portion of the induced current can power the electronic device and a second portion of the induced current can power the second electronic device.

It is to be understood that both the foregoing general description and the following detailed description are exemplary and are intended to provide further explanation of the disclosed subject matter claimed.

The accompanying drawings, which are incorporated in and constitute part of this specification, are included to illustrate and provide a further understanding of the disclosed subject matter. Together with the description, the drawings serve to explain the principles of the disclosed subject matter.

Figure 1A:
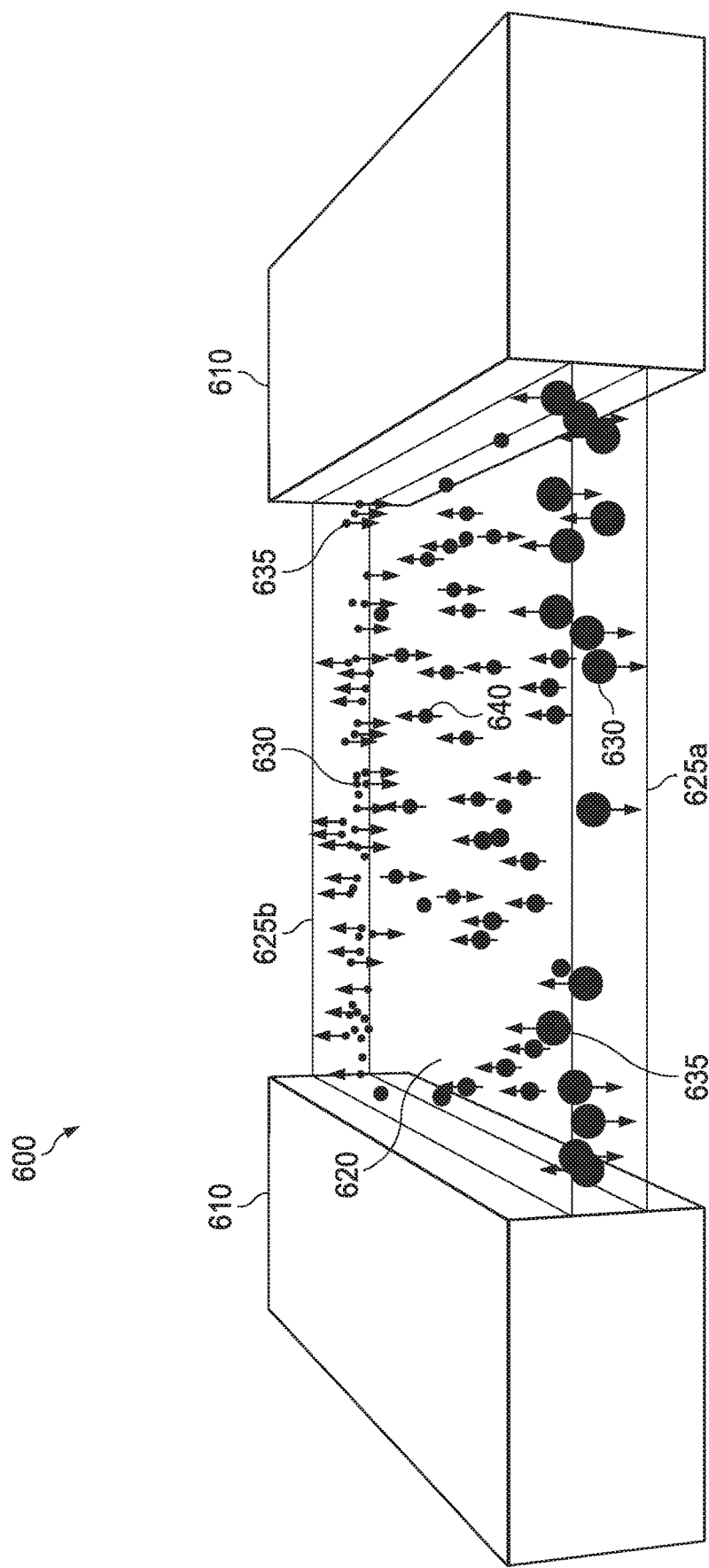
FIGS. 1A-1B are diagrams illustrating exemplary coherence capacitors (with and without nuclei depicted, respectively) in accordance with the disclosed subject matter.

Throughout the drawings, the same reference numerals and characters, unless otherwise stated, are used to denote like features, elements, components or portions of the illustrated embodiments. Moreover, while the present disclosed subject matter will now be described in detail with reference to the figures, it is done so in connection with the illustrative embodiments.

DETAILED DESCRIPTION

Reference will now be made in detail to the various exemplary embodiments of the disclosed subject matter, some of which are illustrated in the accompanying drawings. The structure and corresponding method of operation of the disclosed subject matter will be described in conjunction with the detailed description of the system.

The coherence capacitors, quantum information engines and corresponding methods presented herein can be used for quantum energy storage. The disclosed subject matter is particularly suited for storing energy in nuclear spins. For purpose of illustration and not limitation, nuclear spins in a quantum spin Hall insulator (which is a two-dimensional topological insulator) can be utilized as a pure (non-energetic) memory resource. In a state of polarized nuclear spins (e.g., blank memory), such an insulator can drive an electrical current, thus converting memory resource into useful electrical work, in effect leading to a nonvolatile energy storage. For purpose of illustration and not limitation, such a device can be used in certain thermoelectric engine designs leading to over-efficient operation of these engines, even seemingly exceeding the Carnot bound, if the resources from the nuclear spins are not accounted for properly. Nevertheless, the total energy needed to recharge the device (e.g., reset the "memory") by fully polarizing nuclear spins exceeds the energy extracted in agreement with the second law of thermodynamics and hence demonstrating Landauer's principle. Additionally, a method of generating such nuclear spin polarizations, completing the discharge-recharge cycle of the quantum information engine (QIE), is disclosed.

The accompanying figures, where like reference numerals refer to identical or functionally similar elements throughout the separate views, further illustrate various embodiments and explain various principles and advantages all in accordance with the disclosed subject matter. For purpose of illustration, and not limitation, example embodiments of coherence capacitors and quantum information engines in accordance with the disclosed subject matter are described with reference to FIGS. 1A-9.

Figure 1B:
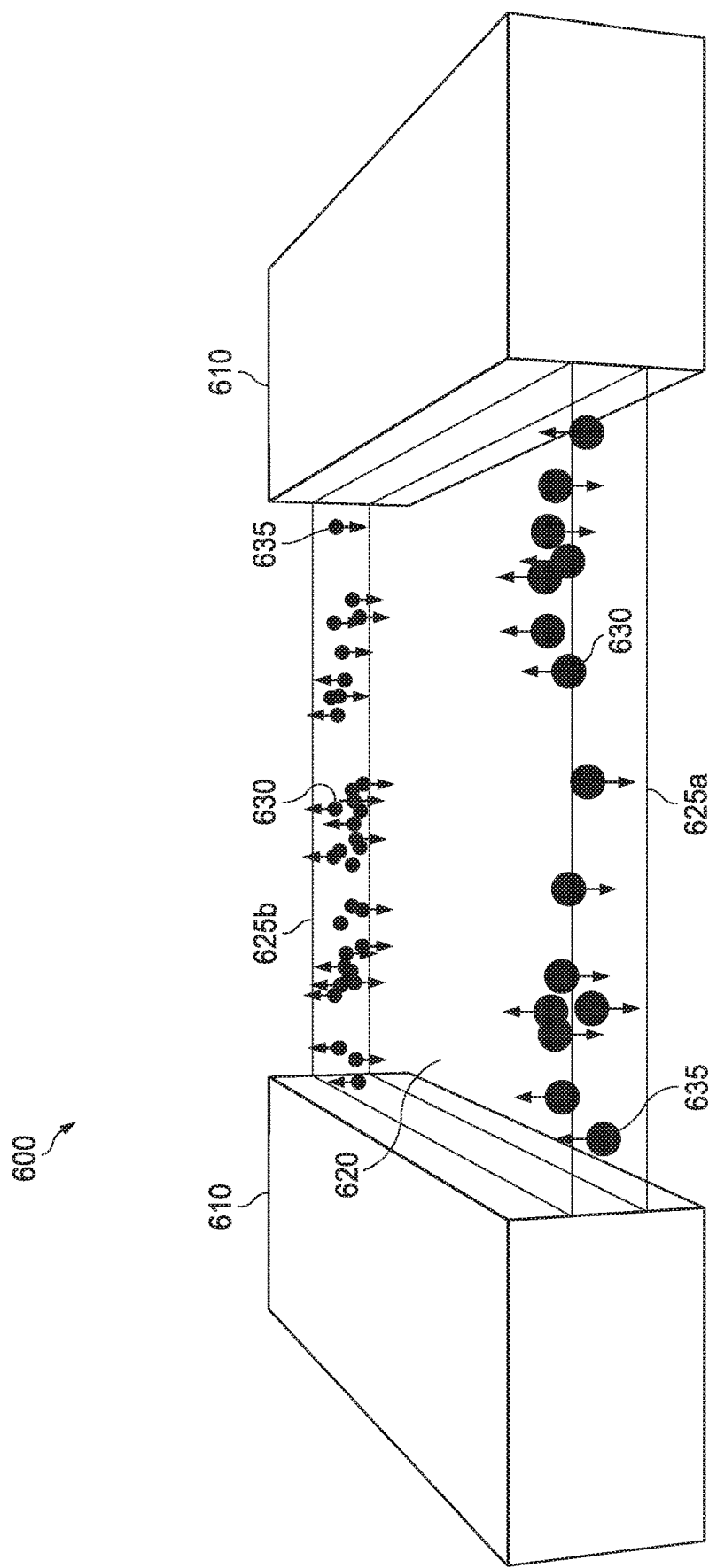
Figure 2:
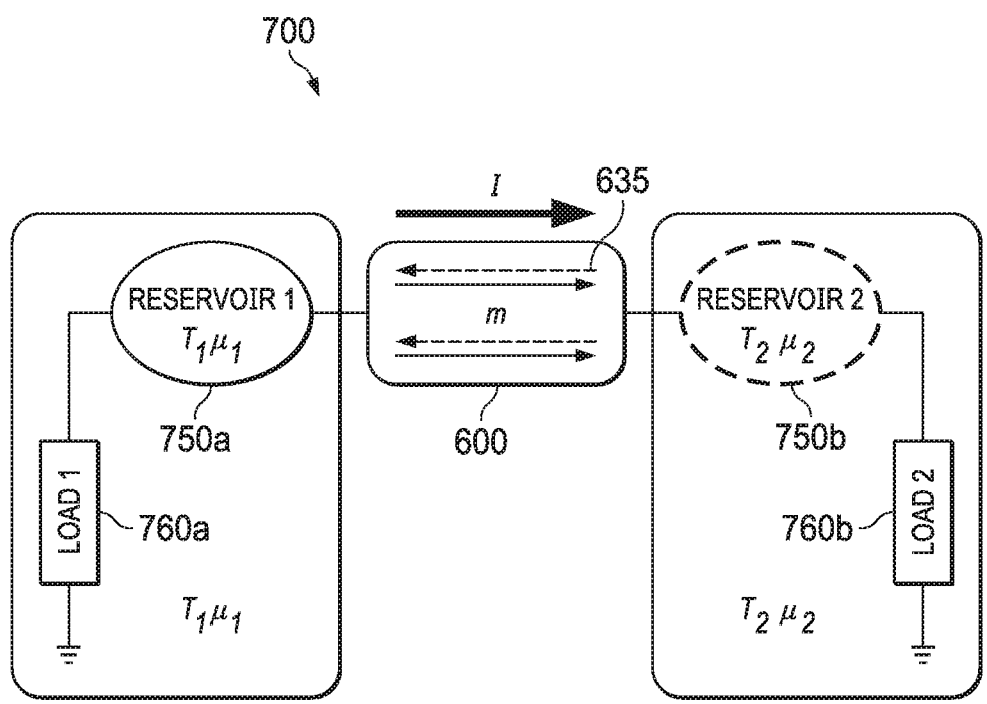
FIG. 2 is a diagram illustrating an exemplary electrical circuit using a coherence capacitor in accordance with the disclosed subject matter.

In accordance with the disclosed subject matter, and with reference to FIGS. 1A-1B and FIG. 2, a quantum information engine 600 can include a topological insulator 620 having at least one edge 625. The topological insulator 620 can have a plurality of nuclei 640, and each nucleus 640 initially can have a spin direction (e.g., up-spin or down-spin as indicated by an up or down arrow). As such, the nuclear spins of the topological insulator can act as a coherence capacitor. For purpose of illustration and not limitation, the nuclei 640 initially can have any quantum mixture of up-spins and down-spins. For purpose of illustration and not limitation, a nuclear spin ½ can be up or down or any quantum superposition of up and down, and spin ½ can have two values for its spin component in the z-direction. Additionally or alternatively, nuclear spins can be 7/2, 9/2, and so on, and the nuclei can have 8 or 10 (respectively) possible values for the spin component in the z-direction, with corresponding number of quantum states. Any of the aforementioned spin states can work equally well as a coherence capacitor.

In certain embodiments, an energy source 750 can be electrically connected to the topological insulator 620 and configured to supply a current I along the edge(s) 625 of the topological insulator 620. The current I can interact with at least one nucleus 640 to flip the spin direction of the nucleus 640. In certain embodiments, terminals 610 can be included at the ends of the topological insulator 620 for electrical connection. The coherence capacitor can be used as a resource storage of the QIE, in which "information" (e.g., spin direction) can be stored by the "memory" (e.g., nuclei 640), as described herein.

Figure 8:
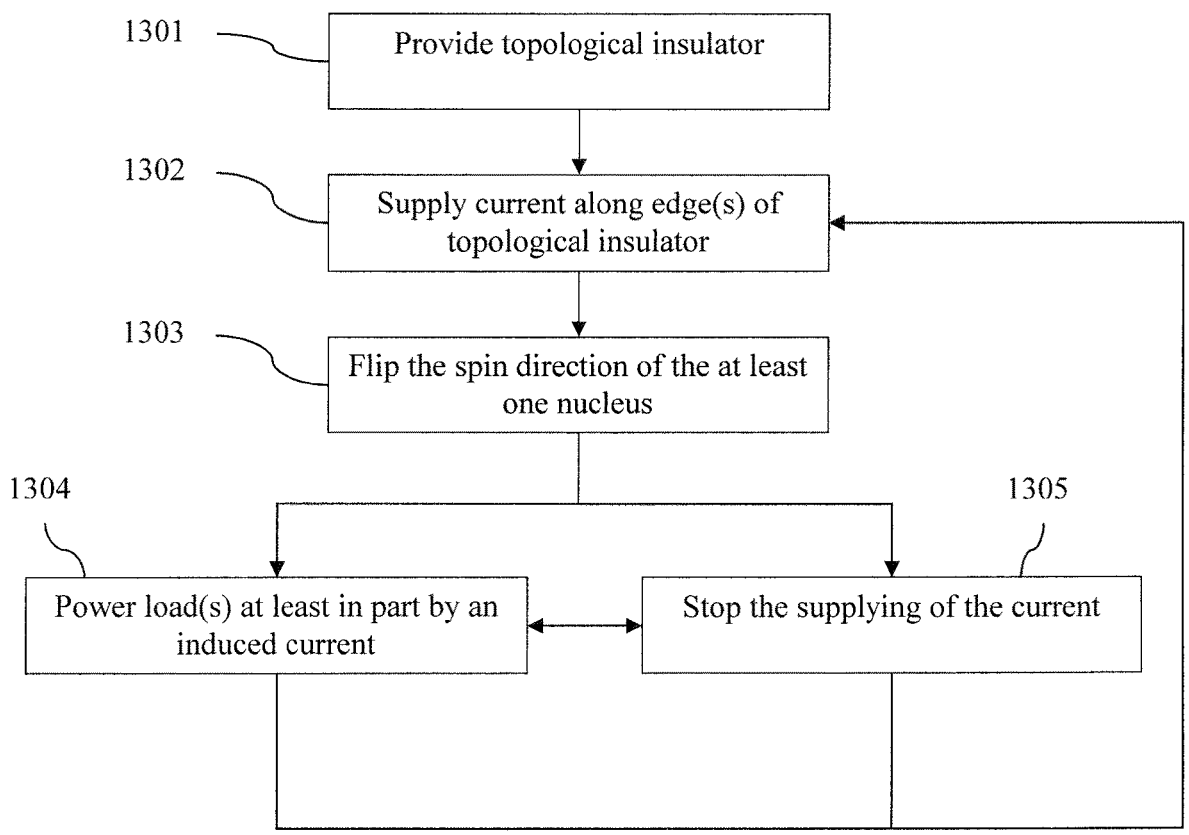
FIG. 8 is a flow diagram of an example method for storing energy with a coherence capacitor in accordance with the disclosed subject matter.

FIG. 8 is a flow diagram of an example method 1300 for storing energy with a coherence capacitor in accordance with the disclosed subject matter. The exemplary quantum information engine 600 of FIGS. 1A-B and electronic circuit 700 of FIG. 2, for the purpose of illustration and not limitation, are discussed with reference to the exemplary method 1300 of FIG. 8.

At 1301, a topological insulator 620 having at least one edge 625 can be provided. The topological insulator 620 can have a plurality of nuclei 640, each initially having a spin direction that is one of up-spin or down-spin, as described herein. A topological insulator 620 can be a semi-conductor material or meta material with the property that no current (e.g., electrons 630, 635) flow in the center of the material but current (e.g., electrons 630, 635) may flow along the topologically protected quantum edge states. As such, electrons 630, 635 can move only in a first direction (e.g., left) or a second direction (e.g., right). Electron 630, 635 spins can correspond to the direction electrons are moving. For example, on a front edge 625a, each electron 635 moving in the first direction (e.g., left) can have an up-spin, and each electron 630 moving in the second direction (e.g., right) can have a down-spin. Spins of electrons 630, 635 on the back edge 625b can have the opposite alignment (e.g., left to down, right to up). For simplicity, in the following discussion, directions of left and right will be reference with respect to the front edge 625a unless otherwise indicated. A topological insulator 620 may store coherent information by aligning the spins of the nuclei 640, as described herein. For purpose of illustration and not limitation, if there are N nuclei, a maximum potential extractable useful work can be proportional to $N^2$, and can also be limited by the Landauer's principle.

For purpose of illustration and not limitation, the topological insulator 620 can be a two-dimensional topological insulator having at least two edges 625. For example, the two-dimensional topological insulator 620 can be a quantum spin Hall insulator (QSHI). For purpose of illustration, suitable QSHIs include but are not limited to experimentally realized quantum well structures, such as an HgTe/HgCdTe quantum well, as described in Konig, M. et al., *The quantum spin Hall effect: Theory and experiment*, J. Phys. Soc. Jpn. 77, 031007 (2008), or an InAs/GaSb double well, as described in Lingjie Du et al., Phys. Rev. Lett. 114, 096802 (2015), the entire disclosures of which are hereby incorporated by reference. Other examples include three dimensional topological insulators such as $Bi_{1-x}Sb_x$, $Bi_2Se_3$, $Bi_2Te_3$, $Sb_2Te_3$ and many others, (see references in Hasan and Kane REVIEWS OF MODERN PHYSICS, VOLUME 82, OCTOBER-DECEMBER 2010, the entire disclosure of which is hereby incorporated by reference). Additional examples of inducing topological states in systems such as p-wave superconducting wires and Rashba wires proximity coupled to an s-wave superconductor include but are not limited to those described in I. Adagideli et al., *Effects of electron scattering on the topological properties of nanowires: Majorana fermions from disorder and superlattices*, Phys. Rev. B 89, 144506 (2014), the entire disclosure of which is hereby incorporated by reference. The dynamics of electrons 630, 635 and holes (not pictured) in such topological insulators 620 can be described by the Hamiltonian:

$$H = \in_k + k_x \tau_x \sigma_z + k_y \tau_y + m_k \tau_z, \quad (1)$$

where $\sigma = (\sigma_x; \sigma_y; \sigma_z)$ and $\tau = (\tau_x; \tau_y; \tau_z)$ are Pauli matrices in the spin and electron-hole space respectively. Further coupling between the spin and orbital motion of the electrons 630, 635 and holes can be given by the spin-orbit term:

$$H_{SO} = (\Delta_1 + \Delta_2 \tau_z)(k_x \sigma_x - k_y \sigma_y \tau_z) + \Delta_z \tau_y \sigma_y. \quad (2)$$

Additionally, a nuclear spin subsystem (i.e. the coherence capacitor) of the topological insulator 620 (of the QIE 600) can form the "memory" of the "Maxwell's Demon" (MD) that can operate on electron-hole dynamics. Interaction between spins of the nuclei 640 and the spins of the electrons 630, 635 can be described by the Fermi contact interaction:

$$H_{s-s} = \lambda \frac{1}{2}(1 + \tau_z)\sigma \cdot I, \quad (3)$$

where $$I = \Sigma_{i=1}^{N} \delta(x - x_i) I_i, \quad (4)$$

with $I_i$ being the spin operator of the ith nucleus.

Topological insulators 620 (e.g., the HgTe quantum well and InAs/GaSb double well described herein) can differ in their effective parameters (such as Fermi velocity), while the main edge state physics can remain the same. One exemplary difference that can have an impact on the disclosed subject matter is the density of nuclear spins. For example and not limitation, in an HgTe/HgCdTe quantum well structure, the density of nuclear spins can be smaller than that of the InAs/GaSb double well structure, and the interaction with nuclear spins can be much weaker in an HgTe/HgCdTe quantum well structure. This can provide a design freedom that can be useful for different functionalities of the coherence capacitor as well as the quantum information engine (QIE), as described herein. For purpose of illustration and not limitation, there are a number of other materials, including meta-topological insulators, or thin films of 3D topological insulators which can feature edge states with different parameters. Additionally or alternatively, more spins with stronger electron-spin coupling can be introduced by doping with magnetic impurities.

The Hamiltonian can be projected to the edge states to obtain the effective edge Hamiltonian:

$$H_0 = -i\hbar v_F \partial_s \sigma_z + \frac{\lambda}{2} M_z(s) \sigma_z \quad (5)$$

and the mixing terms of the form:

$$H_{s-flip} = \lambda \sum_{i=1}^{N} \delta(s - s_i)(I_{i+}\sigma_- + I_{i-}\sigma_+). \quad (6)$$

At 1302, a current I can be supplied along the edge(s) 625 of the topological insulator 620. For purpose of illustration and not limitation, referring also to FIG. 2, the current I can be in a first or second direction (e.g., left or right, respectively) along the edge(s) 625 of the topological insulator 620. When the current I is in the first direction (e.g., left), more electrons 630 can move in the second direction (e.g., right) than the first direction, and when the current I is in the second direction (e.g., right), electrons 635 can move in the first direction (e.g., left) than the second direction. Additionally, each electron 635 moving in the first direction (e.g., left) in first edge can have an up-spin, and each electron 630 moving in the second direction (e.g., right) in the first edge can have a down-spin. Additionally, each electron 635 moving in the first direction (e.g., left) in second edge can have an down-spin, and each electron 630 moving in the second direction (e.g., right) in the second edge can have a up-spin. For example and not limitation, under a bias current I flowing to the right, left movers 635 are supplied by the energy source 750 (e.g., reservoirs 750a and 750b), and the flip process can continue seemingly until all nuclear spins are polarized (e.g., up for the current flowing to the right for the first edge and down for the current flowing to the right for the second edge). As such, dynamical nuclear polarization for the quantum spin Hall edges can be achieved, similar to polarization in other settings such as spin injection from ferromagnets. Accordingly, more than half (e.g. all or substantially all) nuclei 640 can be polarized to have a same spin direction due to interaction with the current I. For example and not limitation each nucleus 640 can be polarized to have a same spin direction.

At 1303, the spin direction of at least one nucleus can be flipped by interaction between the nucleus and the current. For purpose of illustration and not limitation, the interaction between nuclei 640 and electrons 630, 635 can flip the spin of the edge electrons 630, 635 and the spin of one of the nuclei 640, while preserving the z-component of the total spin. Since the spin of the electron 630, 635 and its motion is completely locked, the spin flip can cause back-scattering of an edge electron 630, 635, completely reversing its motion. If there is a charge current flowing to the right, there are more left movers 635 than right movers 630 (more up-spins than down-spins, respectively) and the only way an electron 630, 635 scatters back is via flipping a nuclear spin.

Figure 3A:
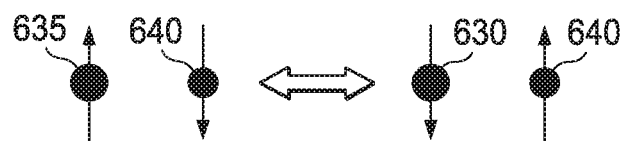
FIGS. 3A-3B are diagrams illustrating exemplary interactions between electrons and nuclei in accordance with the disclosed subject matter.
Figure 3B:
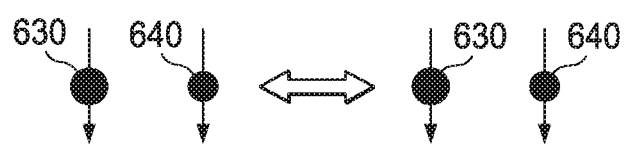

For example and not limitation, referring to FIGS. 3A-3B, when a left-moving electron 635 having up-spin interacts with one of the nuclei 640 having down-spin, the nucleus 640 can flip to up-spin and the electron (now 630) can backscatter to the right and flip to down-spin. Conversely, when one of the electrons 630 having down-spin interacts with one of the nuclei 640 having up-spin, the nucleus 640 can flip to down-spin and the electron (now 635) can backscatter to the left and flip to up-spin. However, when a right moving electron 630 interacts with a nucleus 640 with down-spin, it can result in no change, and when a left moving electron 635 interacts with a nucleus 640 with up-spin, it can result in no change.

Additionally, reverse process is also possible: fully polarized nuclear spins near a quantum spin Hall edge 625 can drive a charge current I. For example and not limitation, the energy source 750 can include at least two reservoirs 750a, 750b electrically connected to the topological insulator 620 and configured to supply a bias voltage across the topological insulator 620. The bias voltage can induce current I along the edge(s) 625 of the topological insulator 620. For purpose of illustration, a first reservoir 750a can be electrically connected to a first end of the edge(s) 625 and a second reservoir 750b can be electrically connected to a second end of the edge(s) 625. Additionally, the first reservoir 750a initially can have one of a different temperature T or a different chemical potential μ than the second reservoir 750b.

At 1304, at least one load 760 can be powered at least in part by an induced current from the topological insulator 620 induced by interaction between the plurality of nuclei 640 and a plurality of electrons 630, 635 in the topological insulator 620. For example, in certain embodiments, at least one load 760 can be electrically connected to at least one of the topological insulator 620 or the energy source 750. The load 760 can be powered at least in part by an induced current I from the topological insulator 620, which can be induced by interaction between the plurality of nuclei 640 and a plurality of electrons 630, 635 in the topological insulator. For example and not limitation, the first reservoir 750a and the second reservoir 750b can eventually have a same temperature T and chemical potential μ after supplying current I to the topological insulator for a period of time, and the current will still flow powered by the topological insulator. For example and not limitation, the load 760 can be powered by an induced current I from the topological insulator 620, wherein the chemical potential of the second reservoir can be higher (denoting the potential drops at the loads) and the induced-current in the topological insulator can flow to the direction of higher voltage (which can be similar to a battery).

For purpose of illustration and not limitation, the main source of spin-flips for nuclear spins can be the interaction between them and the itinerant edge electrons 630, 635. At a quantum spin Hall edge 625, a spin-flip can cause reversal of motion, breaking the balance of left movers 635 and right movers 630 and thus inducing a current. This process can be limited by the spin-flip rate between nuclear spins, which can be orders of magnitude smaller than the coupling between nuclear and electronic spins. Additionally, in the absence of any Zeeman field, the energy of the nuclear up-spins and down-spins can be equal, hence there can be no energy stored (e.g., if ignoring much smaller dipole-dipole interactions between nuclear spins) in the nuclear subsystem, and the distribution of nuclear spins can drive the current without exchanging energy with the electronic subsystem. As such, the nuclear spins can act as a memory resource for a MD: anytime a backscattering occurs, the event leaves its footprint via a spin-flip in the nuclear memory. If the MD starts with a blank memory (e.g., fully up-spins for the first edge and fully down-spins for the second edge), this will drive a current (even between two reservoirs 750a, 750b at equal chemical potential μ and temperature T) converting the memory-resource into useable electrical work.

Additionally, the spin-flip scattering rate at the edge can be calculated using the golden rule. As described above, all left or right moving electrons at edge one can have spin up or down, respectively; accordingly, the corresponding distribution functions can be denoted by the subscript + or −, respectively. The total rate for a single spin-flip scattering, where a right mover 630 becomes a left mover 635, by flipping a nuclear spin from up to down is given by:

$$\Gamma_{-+} = \frac{2\pi}{\hbar} \frac{\lambda^2}{4L^2} \sum_{i=1}^{N} \sum_{k,k'} n_{k+}(1 - n_{k'-})\delta(\epsilon_k - \epsilon_{k'}) \quad (7)$$

$$= \gamma_0 N_\downarrow \int \frac{d\epsilon}{\hbar} f_+(\epsilon)(1 - f_-(\epsilon)), \text{ where} \quad (8)$$

$$\gamma_0 = \frac{\lambda^2}{8\pi\hbar^2 v_F^2} \quad (9)$$

For purpose of illustration and not limitation, the effect of spin-flip scattering on the nuclear spins can be given by the rate equation:

$$\frac{dN_\uparrow}{dt} = \Gamma_{-+} - \Gamma_{+-}. \quad (10)$$

The mean polarization can be used:

$$m = \frac{N_\uparrow - N_\downarrow}{2(N_\uparrow - N_\downarrow)}. \quad (11)$$

This can lead to the following equation:

$$\frac{dm}{dt} = \gamma_0 \Gamma_B - m\gamma_0 \Gamma_T, \quad (12)$$

where:

$$\Gamma_B = \int \frac{d\epsilon}{\hbar} \frac{f_+ - f_-}{2}, \quad (13)$$

$$\Gamma_T = \int \frac{d\epsilon}{\hbar}(f_+ + f_- - 2f_+ f_-). \quad (14)$$

A short edge $\Gamma L/v_F \ll 1$ can be assumed, and the distributions $f_\pm$ can be approximated by the Fermi distribution of the reservoir from which they originate. Thus, the following equations can be obtained:

$$\hbar\Gamma_B = (\mu_L - \mu_R)/2 \quad (15)$$

$$\hbar\Gamma_T = (\mu_L - \mu_R)\coth\left(\frac{\mu_L - \mu_R}{2kT}\right), \quad (16)$$

and the polarization dynamics is given by:

$$m(t) = (m_0 - \bar{m})e^{-t/\tau_m} + \bar{m}, \quad (17)$$

where $$\bar{m} = \Gamma_B/\Gamma_T = (1/2)\tanh\left(\frac{\mu_L - \mu_R}{2k_BT}\right) \quad (18)$$

and $$\tau_m = 1/\gamma_0\Gamma_T. \quad (19)$$

Additionally, there can be two sources of current: (i) the usual voltage bias, and (ii) the presence of nuclear polarization m=(N↑−N↓)/2N driving a current by dominantly flipping (and hence backscattering) spin-up (-down) electrons for m<0 (m>0), hence acting as a Maxwell's demon (MD). The MD induced current can be given by:

$$I_{MD} = -eN(\gamma_0\Gamma_B - m\gamma_0\Gamma_T), \quad (20)$$

while the voltage bias can drive a current:

$$I_b = \frac{e}{h}(\mu_L - \mu_R) = \frac{e^2}{h}V. \quad (21)$$

Accordingly, the total current can be expressed as:

$$I_{tot} = \frac{e}{h}[eV(1 - \pi N\gamma_0) + 2\pi N\gamma_0\Gamma_T m]. \quad (22)$$

At 1305, the supplying of the current I eventually can be stopped, and the load 760 can be powered solely by the induced current I from the topological insulator 620. For example and not limitation, that the current can be not zero for vanishing bias voltage, and thus a "Demon action" can induce a current between the two reservoirs at equal temperature T and chemical potential μ while using the nuclear spins as a memory resource.

For purpose of illustration and not limitation, FIG. 2 depicts an electrical circuit 700 that can be used with an exemplary quantum information engine 600. As depicted, the QIE 600 (which includes a coherence capacitor in the form of the nuclear spins of the topological insulator 620) provides power to load 760a and load 2 706b, which can be modeled by a (reverse) bias voltage V. The power generated can be given by:

$$P = \frac{eV}{h}[V(1 - \pi N\gamma_0) + 2\pi N\gamma_0\Gamma_T m]. \quad (23)$$

For eV<(2ηmΓ_T)/(η−2), with η=2πNγ_0, the value of P can be less than zero (P<0), which can indicate that the circuit is powered by the QIE. (Additionally or alternatively, for $$eV > \frac{2\eta m\Gamma_T}{(\eta - 2)},$$

the circuit can provide power to charge the nuclear spin resource). Over time, power the loads 760 can use up the nuclear spin resource. Integrating over time, the maximal work done by the nuclear spin resource can be determined, and the following suggestive relation can be valid in the weak coupling and short edge limit:

$$W_{tot} = kTN^2\gamma_0. \quad (24)$$

Figure 4A:
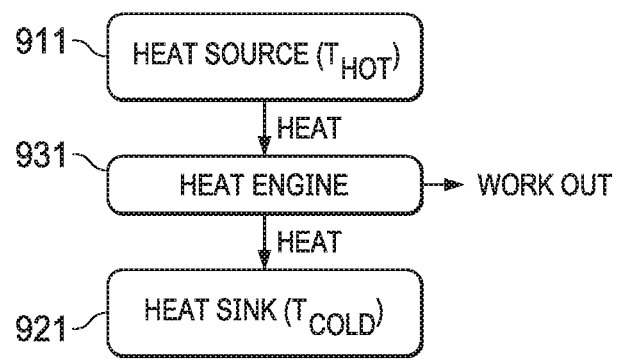
FIG. 4A-4B are diagrams illustrating a conventional heat engine and a coherence capacitor and quantum information engine, respectively, in accordance with the disclosed subject matter.

FIG. 4A is a diagram conceptually illustrating a conventional heat engine. The conventional heat engine can include two temperature reservoirs: heat source 911 and heat sink 921. Heat flows from the heat source 911 to the heat engine 931. Some of the heat is converted into useful work out, and some of the heat flows to the heat sink 921. The maximum efficiency (i.e., Carnot limit) can be expressed as:

$$\text{Max. Efficiency} = \frac{T_{HOT} - T_{COLD}}{T_{HOT}}, \quad (25)$$
$$\text{(Carnot Limit)}$$

where $T_{HOT}$ is the temperature of the heat source 911 and $T_{COLD}$ is the temperature of the heat sink 921. Accordingly, a large temperature difference can be required to obtain sufficient work out.

Figure 4B:
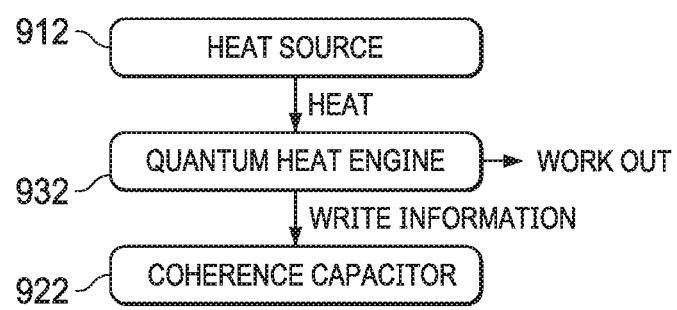

FIG. 4B is a diagram conceptually illustrating use of a coherence capacitor and a quantum information engine, in accordance with the disclosed subject matter. Heat can flow from the heat source 912 to the quantum heat engine 932. The coherence capacitor 922 can act as a memory resource/entropy sink. Quantum heat engine 932 can correlate electrons' movement direction with the memory resource 922; in other words, Quantum heat engine 932 can write information (about the system) to the coherence capacitor 922, and entropy can flow from the quantum heat engine 932 to the coherence capacitor 922. The quantum heat engine 932 can extract at least some of the energy as work out. As such, only one temperature reservoir (e.g., heat source 912) can be required, although it is possible to have more than one. Additionally, the temperature reservoir can be any object or can be the ambient environment. As described herein, the energy required to "charge" the coherence capacitor 922 (e.g., polarize nuclear spins) can exceed the energy released during "discharge" (e.g., powering a load or device with current). For purpose of illustration and not limitation, if there are N nuclei, a maximum potential extractable useful work can be proportional to $N^2$ in the weak coupling short edge limit. Additionally, for purpose of illustration and not limitation, the quantum heat engine 932 and coherence capacitor 922 can be separate devices or can be a single integrated device, as described herein. Together, the quantum heat engine 932 and coherence capacitor 922 operate as a quantum heat engine that converts heat energy into electrical energy.

For purpose of illustration, the "Maxwell Demon" is a thought experiment by physicist James Clerk Maxwell in which a hypothetical "demon" uses his knowledge of the temperature of each atom within a box to control a door. The "demon" can let hotter atoms pass to the right and cooler atoms pass to the left, creating a temperature difference. This temperature difference can be used to drive a heat engine, creating useful work. As discussed above with respect to the quantum information engine 600, referring also to FIGS. 1A-1B and FIG. 3A-3B, when a left-moving electron 635 having up-spin interacts with one of the nuclei 640 having down-spin, the nucleus 640 can flip to up-spin and the electron (now 630) can backscatter to the right and flip to down-spin. Conversely, when one of the electrons 630 having down-spin interacts with one of the nuclei 640 having up-spin, the nucleus 640 can flip to down-spin and the electron (now 635) can backscatter to the left and flip to up-spin. However, when a right moving electron 630 interacts with a nucleus 640 with down-spin, it can result in no change, and when a left moving electron 635 interacts with a nucleus 640 with up-spin, it can result in no change. Thus, the nuclei 640 together with the topological insulator edge state (i.e., electrons 630, 635) can act as a Maxwell demon, in which nuclei 640 interact differently with left moving electrons 635 and right moving electrons 630. This interaction can create an induced current which provides useful work output when the number of left movers 635 exceeds the number of right movers 630, or vice versa. Energy can come from ambient heat (e.g., from the electronic environment or from a heat source such as an operating device). As the current I flows, the alignment of the nuclei 640 can become randomized, using up the coherence resource. Additionally, an external power source can force a current I through the topological insulator 620, which can align the polarization of the nuclei 640, as described herein, thereby charging the QIE 600.

For purpose of illustration, and not limitation, example embodiments of coherence capacitors and quantum information engines used as quantum heat engines in accordance with the disclosed subject matter are described with reference to FIGS. 5A-7B.

In accordance with the disclosed subject matter, and with reference to FIGS. 5A-7B, a system 1000, 1100, 1200 for storing and using quantum energy can include an electronic device 1080 that produces heat H while operating. A quantum heat engine (e.g. combined quantum information engine 1090a and coherence capacitor 1090b) can be in thermal contact with and electrically connected to the electronic device 1080. The quantum heat engine 1090 can be any suitable quantum heat engine, including but not limited to the quantum heat engines described herein. A coherence capacitor 1090b can be connected to the quantum information engine 1090a. The coherence capacitor 1090b can be any suitable coherence capacitor, including but not limited to the coherence capacitors described above. A quantum information engine 1090a can be in thermal contact with the electronic device 1080. The quantum information engine 1090a can be any suitable quantum information engine, including but not limited to the quantum information engines described above. For example and not limitation, a quantum information engine 1090a can include electron reservoirs that can be in thermal and/or electrical contact with the electrical device 1080 and coupled to the edge(s) of a topological insulator of a coherence capacitor 1090b. Additionally, for purpose of illustration and not limitation, the quantum information engine 1090a and coherence capacitor 1090b can be a single integrated device, e.g., integrated coherence capacitor/quantum information engine (CC/QIE) 1090. For example and not limitation, a CC/QIE 1090 can be realized by coupling a topological insulator edge to electron reservoirs that can be in thermal and/or electrical contact with the electrical device 1080. Alternatively, the quantum information engine 1090a and coherence capacitor 1090b can be separate devices. The heat H produced by the electronic device 1080 can be dissipated to the quantum information engine 1090a. The quantum information engine 1090a can generate an induced current to bias the electronic device 1080. An induced current can be induced in the quantum information engine 1090a, as described herein. The current I induced in the quantum information engine 1090a can power the electronic device 1080.

In certain embodiments, referring also to FIGS. 1A-1B, the coherence capacitor 1090b can include a topological insulator 620 having at least one edge 625, as described herein. Additionally, the topological insulator can have a plurality of electrons 630, 635 along the edge(s) 625, as described herein. The electrons 630, 635 can interact with the nuclei 640, as described herein. The current I can be induced along the edge(s) 625 of the topological insulator 620 when a first number of electrons 635 moving in the first direction (e.g., left) does not equal a second number of electrons 630 moving in the second direction (e.g., right). For example, when the current I is in the left direction, the number of electrons 635 moving left can be less than the number of electrons 630 moving right. Alternatively, when the current I is in the right direction, the number of electrons 635 moving left can be greater than the number of electrons 630 moving right.

Figure 9:
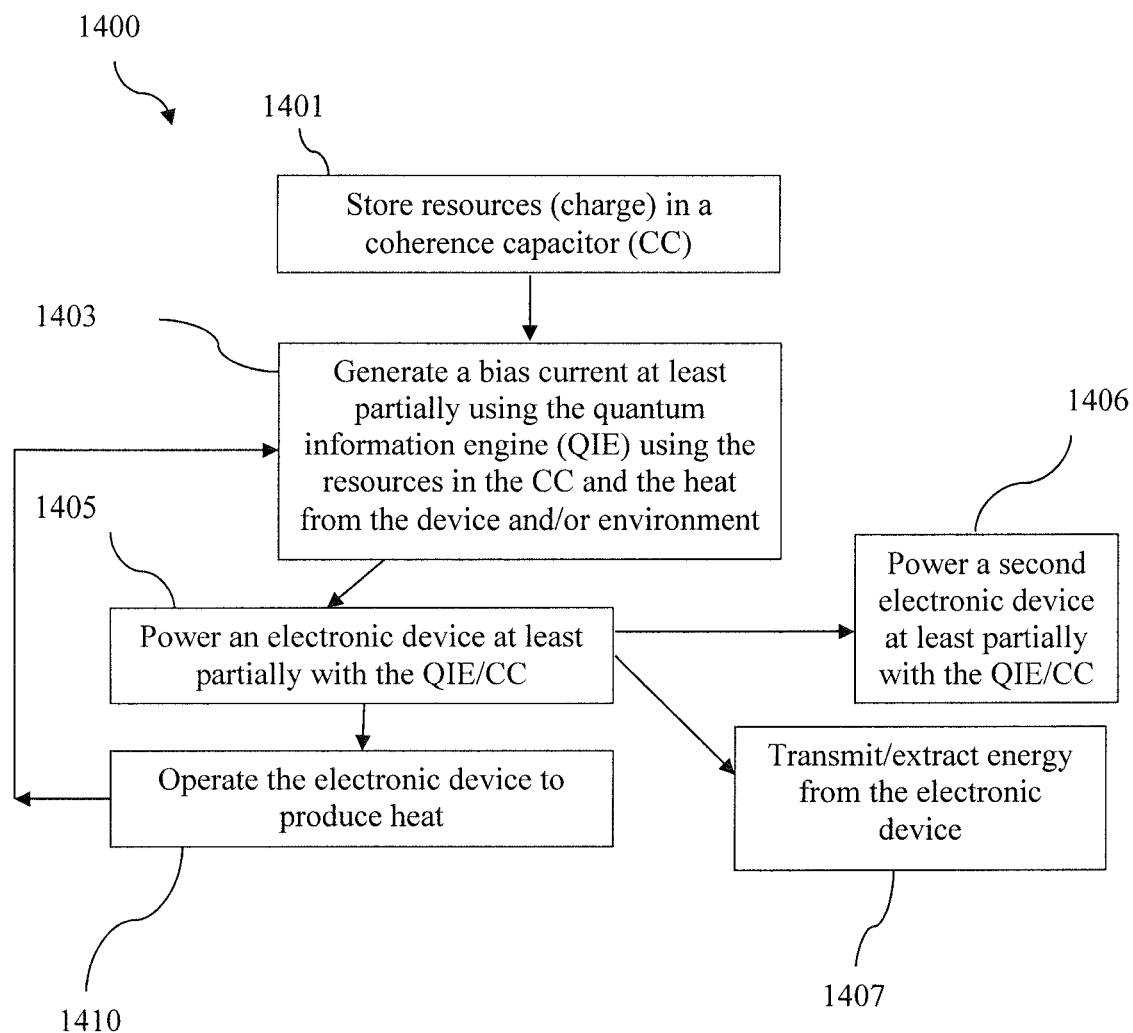
FIG. 9 is a flow diagram of an example method for storing and using energy with a coherence capacitor and quantum information engine in accordance with the disclosed subject matter.

FIG. 9 is a flow diagram of an example method 1400 for storing and using energy with a coherence capacitor in accordance with the disclosed subject matter. The exemplary systems 1000, 1100, 1200 of FIGS. 5A-7B, for the purpose of illustration and not limitation, are discussed with reference to the exemplary method 1400 of FIG. 9.

At 1401, energy can be stored in a coherence capacitor 1090b, as described herein. In certain embodiments, storing energy in the coherence capacitor 1090b can include supplying direct current (DC) power to the coherence capacitor 1090b. For purpose of illustration and not limitation, a DC power source can be electrically connected to the coherence capacitor 1090b. Additionally or alternatively, any suitable source of bias current or bias voltage can be used to charge the coherence capacitor 1090b, as described herein.

The coherence capacitor 1090b can be electrically connected to an electronic device 1080 and a quantum information engine 1090a. The quantum information engine 1090a can be in thermal contact with the electronic device 1080. For example and not limitation, the coherence capacitor 1090b and quantum information engine 1090a can be a single integrated CC/QIE 1090 integrated onto the electronic device 1080, as described herein. For purpose of illustration and not limitation, the electronic device 1080 can be any suitable electronic device, including but not limited to one or more of an integrated circuit, an application specific integrated circuit (ASIC), a power amp (PA), a focal plane array (FPA), a radar transmitter, a mobile phone, a mobile computer device, an electric motor on an aircraft, or any part thereof.

At 1410, the electronic device 1080 can operate to produce heat H. For purpose of illustration and not limitation, at least a portion of the power generated by the current I from the CC/QIE 1090 can be dissipated as heat H by the electronic device 1080.

At 1403, an induced current can be generated by the quantum information engine 1090a to bias the electronic device 1080 using the resources (e.g., nuclear spins) in the coherence capacitor 1090b and heat from the electronic device 1080 or the environment. For purpose of illustration and not limitation, the induced current can be induced in the quantum information engine 1090a as described above. Additionally, for example and not limitation, as the current I flows, the alignment of the nuclei 640 can become randomized, using up the information resource. Energy to provide an induced current by the quantum information engine 1090a using information resource can come from ambient heat (e.g., from the operating device and/or the surrounding environment).

At 1405, the electronic device 1080 can be powered with the current I from the CC/QIE 1090. For example, as described herein, a current can be produced along the edge(s) 625 of the topological insulator 620 when the number of left-moving electrons 635 is different than the number of right-moving electrons 630. Since the coherence capacitor 1090*b* can be connected to the electronic device 1080, the current can flow to the electronic device 1080.

Additionally, at 1406, a second electronic device 1085 can be powered by the CC/QIE 1090, as described herein. Additionally or alternatively, at 1407 the electronic device 1080 can output energy, e.g., transmit radio frequency (RF) power, as described herein.

Figure 5A:
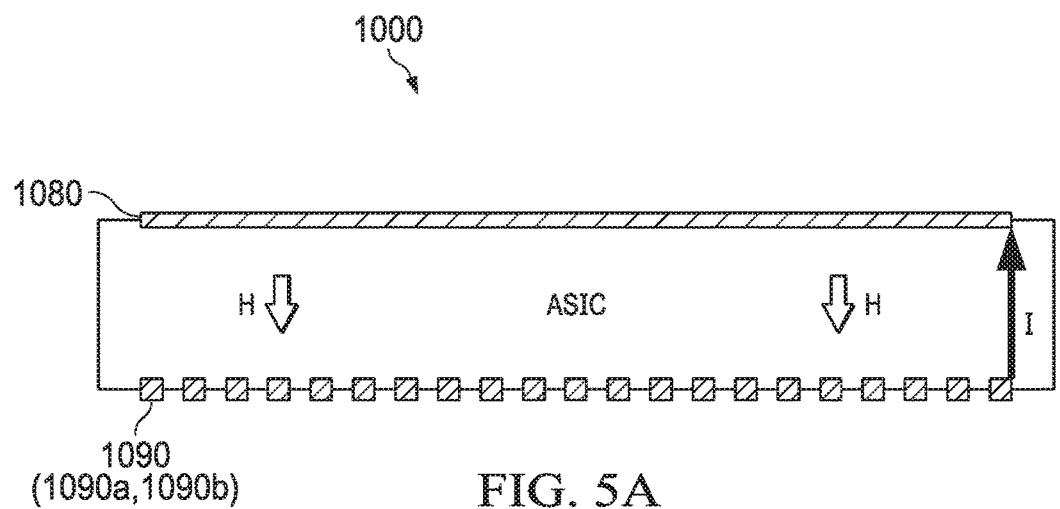
FIG. 5A-5B are diagrams illustrating an exemplary coherence capacitor and quantum information engine integrated with an application specific integrated circuit (ASIC) in accordance with the disclosed subject matter.
Figure 5B:
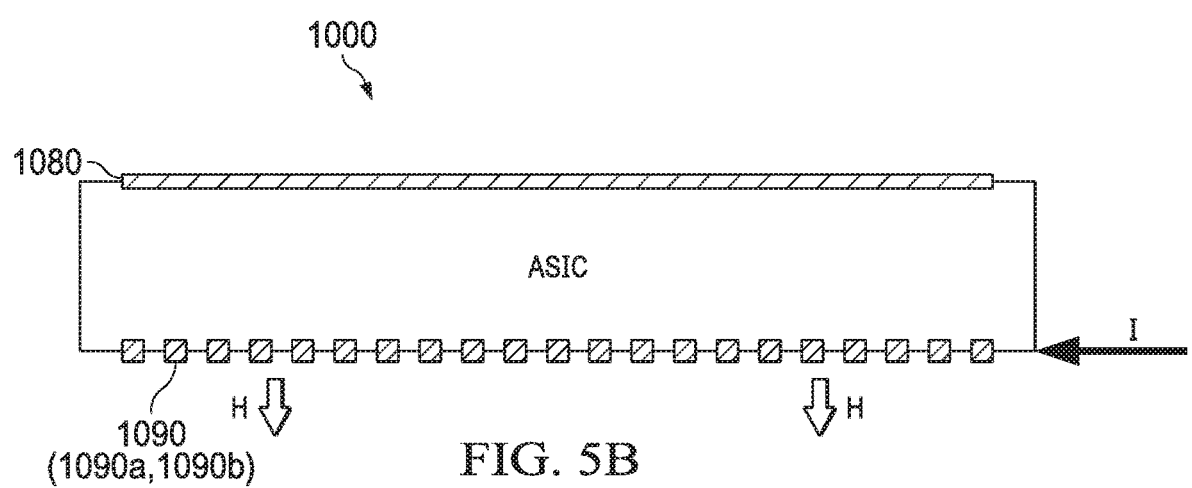

For purpose of illustration and not limitation, with reference to FIGS. 5A-5B, an exemplary system 1000 with coherence capacitor 1090*b* and quantum information engine 1090*a* can be integrated with an application specific integrated circuit (ASIC) 1080. For example and not limitation, the ASIC 1080 can be assumed to provide no useful work output; i.e., all applied power can be dissipated as heat. The coherence capacitor 1090*b* and quantum information engine 1090*a* may be implemented on a flip side of the ASIC 1080 or above an active surface of the ASIC 1080. As such, a low impedance thermal path can be provided between ASIC circuitry 1080 and quantum information engine 1090*a*. In certain embodiments, the electronic device 1080, the coherence capacitor 1090*b*, and the quantum information engine 1090*a* can be in a same package. For example, the quantum information engine 1090*a* and coherence capacitor 1090*b* can be a single integrated device, e.g., CC/QIE 1090, integrated onto the ASIC 1080. An integrated CC/QIE 1090 can have relatively little size/mass compared to the package of the ASIC 1080, thus having little to no size/mass impact on the overall package. Additionally, the integrated CC/QIE 1090 can cover a very small portion of the ASIC area. The integrated CC/QIE 1090 can perform as a power source for the ASIC 1080, and energy stored in the coherence capacitor 1090*a* can be used to operate the ASIC 1080 without any external power source or battery. In other words, the ASIC 1080 essentially has its own battery and can exchange no net heat with the environment while in operation. Additionally, logic circuitry to control the CC/QIE 1090 may be implemented in ASIC 1080.

In certain embodiments, all power generated by the CC/QIE 1090 can be dissipated as heat H within the electronic device 1080 (e.g., logic ASIC). Additionally, for example, and as depicted in FIG. 5A, during normal operation (e.g., operation from energy stored in the coherence capacitor), heat H can be dissipated by operating ASIC 1080, and the heat H can be less than or equal to heat required by quantum information engine 1090*a* to generate DC power (i.e., in the form of applied current) needed to bias ASIC 1080. Accordingly, the electronic device 1080 can not heat during operation since CC/QIE 1090 can use all of the heat H. The system 1000 can improve device performance and reliability due to operation at ambient temperature. Additionally, the system 1000 can improve safety, as the coherence capacitor 1090*b* stores information, unlike a conventional battery which stores chemical energy, which can be a fire risk.

In certain embodiments, a direct current (DC) power source can be electrically connected to the coherence capacitor 1090*b*, as depicted by current I flowing into CC/QIE 1090 in FIG. 5B. To store energy in the coherence capacitor 1090*b*, each nucleus 640 can be polarized to have a same spin direction due to interaction with a DC current when the DC power source is turned on, as described herein. As the CC/QIE 1090 would not be extracting heat H during charging, the heat H can be dissipated to the surrounding environment during charging. The net heat dissipated in the full cycle of charging and discharging can be positive in agreement with the second law.

Additionally or alternatively, the DC power source can be electrically connected to the electronic device 1080 such that the electronic device is powered at least in part by the DC power source when the DC power source is turned on, and the electronic device can be powered by the coherence capacitor 1090*b* when the DC power source is turned off. As such the electronic device 1080 can operate during charging, but the electronic device 1080 can heat up during charging. Alternatively, the electronic device 1080 can be disabled during charging.

In certain embodiment, the electronic device 1080 can include logic circuitry to control the coherence capacitor 1090*b* and/or quantum information engine 1090*a*.

For purpose of illustration and not limitation, the system 1000 can be designed for operations with relatively short time scales, e.g., during a radar transmit pulse or while an operator is talking. Alternatively, the system 1000 can be designed for operation with relatively longer time scales, e.g., powering a cell phone, laptop computer, an electric motor on an aircraft, or a drone.

Figure 6A:
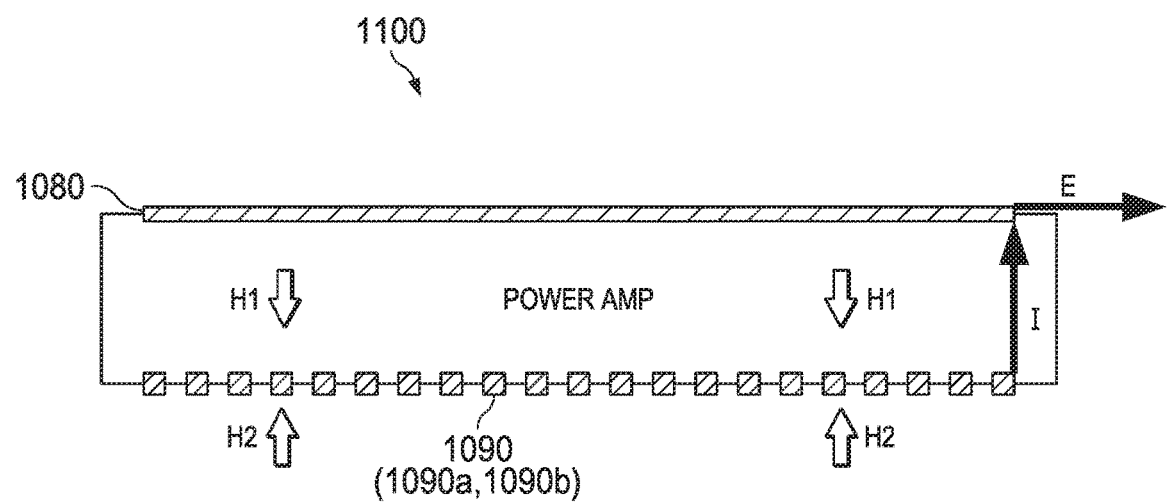
FIG. 6A-6B are diagrams illustrating an exemplary coherence capacitor and quantum information engine integrated with a power amp in accordance with the disclosed subject matter.
Figure 6B:
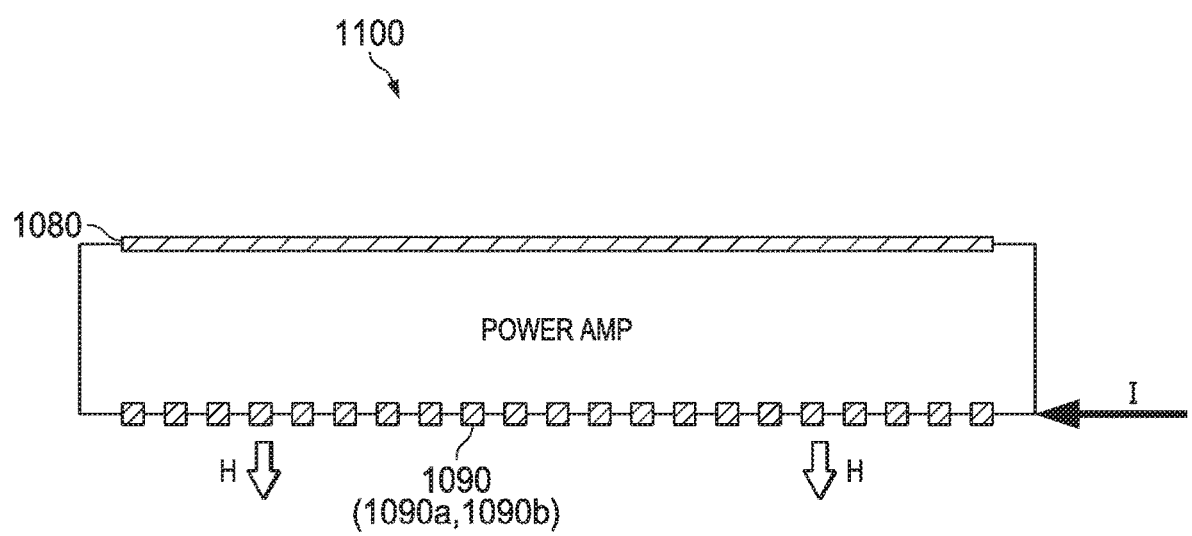

For purpose of illustration and not limitation, with reference to FIGS. 6A-6B, an exemplary system 1100 with a CC/QIE 1090 integrated with an electronic device 1080 (e.g., a power amp) in accordance with the disclosed subject matter. For example and not limitation, the electronic device 1080 can be assumed to provide useful work output. For example, energy device 1080 can be any circuit that provides useful output power, including but not limited to, a power amp to provide useful RF power output. The coherence capacitor 1090*b* and quantum information engine 1090*a* may be implemented on a flip side of the electronic device 1080 (e.g., power amp and integrated circuit (IC)) or above an active surface of the electronic device 1080. As such, a low impedance thermal path can be provided between power amp circuitry 1080 and quantum information engine 1090*a*. In certain embodiments, the electronic device 1080, the coherence capacitor 1090*b*, and the quantum information engine 1090*a* can be in a same package. For example, the quantum information engine 1090*a* and coherence capacitor 1090*b* can be a single integrated device, e.g., CC/QIE 1090, integrated onto the power amp 1080. Additionally, the substrate of the power amp 1080 can be thinned under the active devices to place the CC/QIE 1090 as close as possible to the active region of the power amp 1080 transistors/active circuits. An integrated CC/QIE 1090 can have relatively little size/mass compared to the package of the power amp 1080, thus having little to no size/mass impact on the overall package. Additionally, the integrated CC/QIE 1090 can cover a very small portion of the power amp area. The integrated CC/QIE 1090 can perform as a power storage for the power amp 1080 and can cool the power amp 1080. The cooling provided by the combination of the CC/QIE 1090 with the power amp 1080 can improve the performance and reliability of the power amp 1080 and permit a more compact transistor layout for the power amp 1080, which otherwise would be less compact in order to dissipate heat.

In certain embodiments, for example, and as depicted in FIG. 6A, some of the DC power generated by the CC/QIE 1090 can be output (e.g., transmitted) as useful power (e.g., RF power). For purpose of illustration and not limitation, energy (e.g., RF energy) can be transmitted from the electronic device 1080. For example, a first portion of the power generated by CC/QIE 1090 can be used to transmit energy from the electronic device 1080 and a second portion of the power generated by CC/QIE 1090 can be dissipated as heat by the electronic device 1080.

During normal operation (e.g., operation powered by electrical work harvested using resources stored in the coherence capacitor), the portion of the energy dissipated as heat H1 by operating power amplifier 1080 can be less than the heat required by quantum information engine 1090*a* to generate DC power (i.e., current) needed to bias power amp 1080. Accordingly, the CC/QIE 1090 can cool down to create a temperature difference resulting in a heat flow from the surrounding environment into the CC/QIE 1090. Heat H2 can be absorbed from the surrounding environment to equal to output RF power from the power amp 1080. Total heat (H1+H2) absorbed by CC/QIE 1090 can be substantially equal to the total electrical power provided to electronic device 1080. Because power amplifier 1080 is in close thermal contact with CC/QIE 1090 it will cool down as CC/QIE 1090 cools down. Additionally, such operation can be useful for short time scales, e.g., during radar transmit pulse.

As set forth above, the system 1100 can cool down the power amp 1080 during operation, which can improve device performance and reliability due to operation below ambient temperature. For purpose of illustration and not limitation, during charging of the CC/QIE 1090, the electronic device 1080 can heat up. The electronic device 1080 can be configured to not operate during the charging. Additionally or alternatively, charging can be performed during periods when the electronic 1080 is operating with relatively less power, e.g., during a radar receive period.

In certain embodiments, a direct current (DC) power supply can be electrically connected to the coherence capacitor 1090*b*, as depicted by current I flowing into CC/QIE 1090 in FIG. 6B. In certain embodiments, the power supply can be sized for average power consumption. This sizing can eliminate or reduce complexity of a power supply designed to provide the peak DC power and/or eliminate or reduce complexity of including a large capacitor bank to support peak current demand. As described herein, the CC/QIE 1090 can provide power storage to support peak current demand.

Figure 7A:
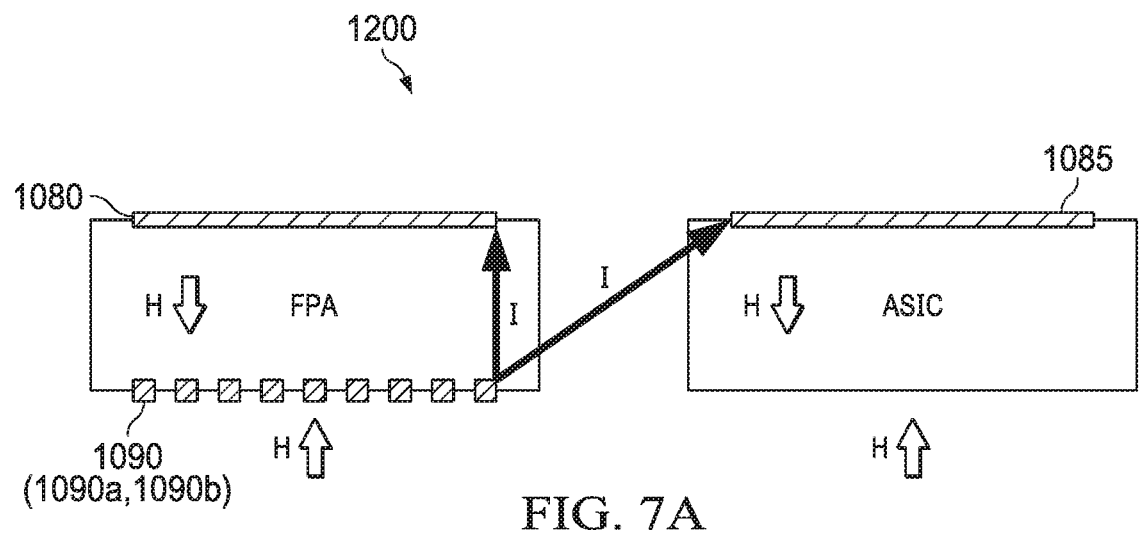
FIG. 7A-7B are diagrams illustrating an exemplary coherence capacitor and quantum information engine integrated with a first device and providing power to first and second devices in accordance with the disclosed subject matter.
Figure 7B:
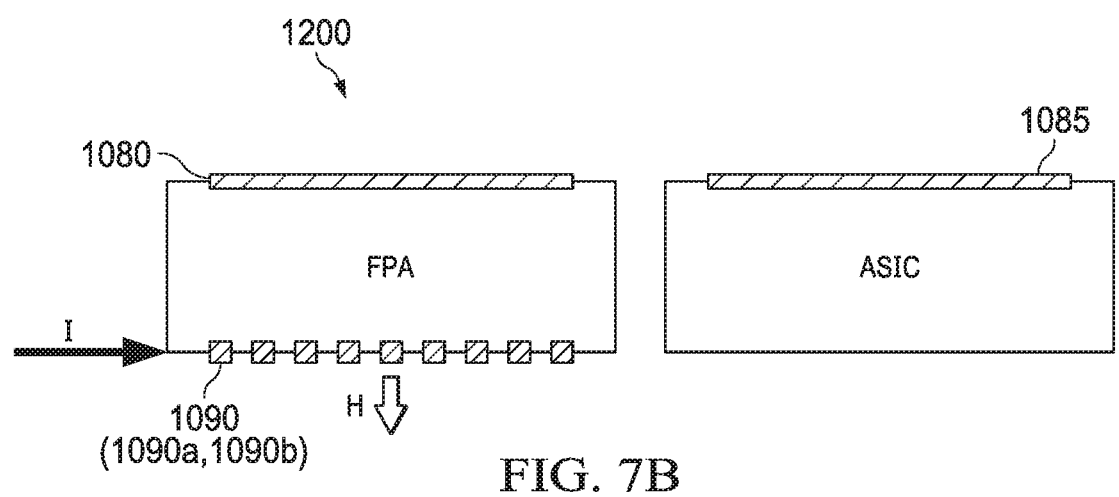

For purpose of illustration and not limitation, with reference to FIGS. 7A-7B, an exemplary system 1200 with coherence capacitor 1090*b* and quantum information engine 1090*a* can be integrated with a first electronic device 1080 and also provide power to a second electronic device 1085. For purpose of illustration and not limitation, a first portion of the current from the CC/QIE 1090 can power the first electronic device 1080 and a second portion of the current from the coherence capacitor can power the second electronic device 1085. In certain embodiments, the first electronic device 1080 can dissipate less power than the second electronic device 1085 or vice-versa. Alternatively, the first electronic device 1080 and second electronic device 1085 can dissipate the same power. The integrated CC/QIE 1090 can perform as a power source for the first electronic device 1080 and second electronic device 1085, and energy stored in the coherence capacitor 1090*a* can be used to operate the devices without any external power source or battery. In other words, the devices essentially have their own battery and dissipate decreased net heat (or not net heat) in operation; however the total net heat dissipated in the full cycle of charging and discharging can be positive, in agreement with the second law. Additionally, logic circuitry to control the CC/QIE 1090 may be implemented in one of the electronic devices, e.g., the second electronic device 1085.

In certain embodiments, and as depicted in FIG. 7A, the first electronic device 1080 can be a device for which cooling improves operational capability. For example and not limitation, the first device 1080 can be a laser or an imagery device such as a focal plane array (FPA). Additionally, the second electronic device 1085 can be a device for which cooling is less crucial. For example and not limitation, the second electronic device 1085 can be an ASIC or an amplifier.

During normal operation (e.g., operation from energy stored in the coherence capacitor), the heat H dissipated by the first electronic device (e.g., FPA) 1080 and the second electronic device (e.g., ASIC) 1085 can be less than or equal to the heat required by quantum information engine 1090*a* to generate DC power (i.e., current) needed to bias the FPA 1080 and the ASIC 1085. The total heat flow into the CC/QIE 1090 to generate the DC power to bias devices 1080 and 1085 can be greater than the heat dissipated by device 1080. ASIC 1085 can be remote from CC/QIE 1090 so that the heat dissipated by ASIC 1085 does not flow to CC/QIE 1090. For example and not limitation, additional heat flows from the surrounding environment of CC/QIE 1090 can provide additional heat to amount to the total heat needed by CC/QIE 1090 to generate the DC power. CC/QIE 1090 can cool down relative to its surroundings (e.g., as current is generated), and the heat flow from these surroundings to CC/QIE 1090 can occur (e.g., as a result of the difference in temperature between the cooled CC/QIE 1090 and the surrounding environment). As previously described, CC/QIE 1090 can be thermally coupled to FPA 1080. FPA 1080 can cool down as CC/QHE 1090 cools down. The ASIC 1085 can warm up as the heat H therefrom can be dissipated at least partially into the surrounding environment. The heat H dissipated by ASIC 1085 can be less than or equal to heating during typical operation without a CC/QHE 1090. Cooling of the FPA 1080 can increase if FPA 1080 power consumption is decreased compared to ASIC 1085 power consumption.

In certain embodiments, a direct current (DC) power supply can be electrically connected to the coherence capacitor 1090*b*, as depicted by current I flowing into CC/QIE 1090 in FIG. 7B. For purpose of illustration and not limitation, during charging of the CC/QIE 1090, the first electronic device 1080 can heat up. As such, for example and not limitation, the first electronic device 1080 can be configured to not operate during the charging. Additionally or alternatively, first electronic device 1080 can be configured to operate during charging, with the assumption that heating can degrade performance of the first electronic device 1080.

The foregoing merely illustrates the principles of the disclosed subject matter. The presently disclosed subject matter is not to be limited in scope by the specific embodiments herein. Indeed, various modifications of the disclosed subject matter in addition to those described herein will become apparent to those skilled in the art from the foregoing description and the accompanying figures. Such modifications are intended to fall within the scope of the appended claims. It will thus be appreciated that those skilled in the art will be able to devise numerous techniques which, although not explicitly described herein, embody the principles of the disclosed subject matter and are thus within its spirit and scope.

What is claimed is:

1. A system for storing and using quantum energy, comprising:
    an electronic device that produces heat while operating; and
    a quantum heat engine in thermal contact with the electronic device and electrically connected to the electronic device, wherein:

the heat produced by the electronic device dissipates to the quantum heat engine, the quantum heat engine generates an induced current to bias the electronic device, the quantum heat engine comprises a quantum information engine and a coherence capacitor, the quantum information engine comprises a topological insulator having at least one edge, the coherence capacitor comprises nuclei of atoms within the topological insulator, each nucleus of the nuclei having a spin direction, the topological insulator has a plurality of electrons along the at least one edge, each electron initially having a spin direction corresponding to a direction of movement along the at least one edge, and when a given one of the electrons interacts with a given one of the nuclei, the spin direction of the given one of the nuclei flips.

2. The system of claim 1, wherein:
the quantum information engine absorbs heat from its surroundings and uses memory resources from the coherence capacitor to generate the induced current.

3. The system of claim 1, wherein:
each electron initially has a spin direction that is one of up-spin or down-spin corresponding to moving in a first direction or a second direction along the at least one edge, respectively, when a first one of the electrons having up-spin interacts with a first one of the nuclei having down-spin, the first one of the nuclei flips to up-spin and the first one of the electrons backscatters in the second direction and flips to down-spin, and when a second one of the electrons having down-spin interacts with a second one of the nuclei having up-spin, the second one of the nuclei flips to down-spin and the second one of the electrons backscatters in the first direction and flips to up-spin, and the induced current is induced along the at least one edge of the topological insulator when a first number of the plurality of electrons moving in the first direction does not equal a second number of the plurality of electrons moving in the second direction.

4. The system of claim 3, wherein:
when the induced current is in the first direction, the first number of electrons moving in the first direction is less than the second number of electrons moving in the second direction, and when the induced current is in the second direction, the first number of electrons moving in the first direction is greater than the second number of electrons moving in the second direction.

5. The system of claim 1, wherein the electronic device is one of an application specific integrated circuit (ASIC), a power amp (PA), a focal plane array (FPA), a radar transmitter, a mobile phone, a mobile computer device, or an electric motor for an aircraft.

6. The system of claim 1, further comprising a direct current (DC) power source electrically connected to the topological insulator, wherein more than half of the nuclei are polarized to have a desired spin direction due to interaction with a DC current when the DC power source is turned on.

7. The system of claim 6, wherein:
the DC power source is electrically connected to the electronic device, the electronic device is powered at least in part by the DC power source when the DC power source is turned on, and the electronic device is powered by the quantum heat engine when the DC power source is turned off.

8. The system of claim 6, wherein the electronic device does not operate while the DC power source is turned on.

9. The system of claim 6, wherein the DC power source provides current corresponding to an average power consumption of the electronic device.

10. The system of claim 1, wherein the power generated by the induced current is dissipated as heat by the electronic device.

11. The system of claim 10, wherein heat dissipated by the electronic device is equal to the heat absorbed and converted to electrical work by generating an induced current by the quantum heat engine.

12. The system of claim 1, wherein a first portion of the power generated by the induced current is used to transmit energy from the electronic device and a second portion of the power generated by the induced current is dissipated as heat by the electronic device.

13. The system of claim 12, wherein the energy transmitted from the electronic device comprises radio frequency energy.

14. The system of claim 1, wherein the quantum heat engine is integrated onto the electronic device.

15. The system of claim 1, wherein ambient heat from a surrounding environment induces an additional current in the quantum heat engine.

16. The system of claim 15, wherein the quantum heat engine becomes cooler as the induced current is generated, and wherein the electronic device becomes cooler due to thermal contact with the quantum heat engine.

17. The system of claim 1, further comprising a second electronic device electrically connected to the quantum heat engine, wherein a first portion of the induced current powers the electronic device and a second portion of the induced current powers the second electronic device, and the second device is not in thermal contact with the quantum heat engine.

18. The system of claim 1, wherein the electronic device comprises logic circuitry to control the coherence capacitor.

19. A method for storing and using energy, comprising:
storing energy in a coherence capacitor, the coherence capacitor electrically connected to an electronic device and a quantum information engine, the quantum information engine in thermal contact with the electronic device;

operating the electronic device to produce heat; and generating an induced current by the quantum information engine to bias the electronic device using memory resource from the coherence capacitor;

wherein:
the quantum information engine comprises a topological insulator having at least one edge, the coherence capacitor comprises nuclei of atoms within the topological insulator, each nucleus of the nuclei having a spin direction, the topological insulator has a plurality of electrons along the at least one edge, each electron initially having a spin direction corresponding to a direction of movement along the at least one edge, and the method further comprises one of the electrons interacting with one of the nuclei to flip its spin direction.

20. The method of claim 19, wherein storing energy comprises storing memory resource in nuclear spins within the coherence capacitor.

21. The method of claim 19, wherein storing energy in the coherence capacitor comprises supplying direct current (DC) power to the coherence capacitor.

22. The method of claim 19, further comprising:
transmitting energy from the electronic device,
wherein a first portion of the power generated by the induced current is used to transmit energy from the electronic device and a second portion of the power generated by the induced current is dissipated as heat by the electronic device.

23. The method of claim 19, further comprising:
powering a second electronic device with the induced current,
wherein a first portion of the induced current powers the electronic device and a second portion of the induced current powers the second electronic device.

24. The method of claim 19, wherein the electronic device is one of an application specific integrated circuit (ASIC), a power amp (PA), a focal plane array (FPA), a radar transmitter, a mobile phone, a mobile computer device, or an electric motor on an aircraft.

* * * * *